(12) United States Patent
Chen et al.

(10) Patent No.: US 9,588,597 B2
(45) Date of Patent: Mar. 7, 2017

(54) OPTICAL POINTING DEVICE AND METHOD FOR DETECTING AN OPTICAL POINTING

(71) Applicant: PIXART IMAGING INC., Hsin-Chu (TW)

(72) Inventors: Hui-Hsuan Chen, Hsin-Chu (TW); Wen-Yen Su, Hsin-Chu (TW); Tien-Chia Liu, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 217 days.

(21) Appl. No.: 14/067,425

(22) Filed: Oct. 30, 2013

(65) Prior Publication Data
US 2014/0209783 A1    Jul. 31, 2014

(30) Foreign Application Priority Data

Jan. 30, 2013    (TW) .............................. 102103385 A

(51) Int. Cl.
*G06F 3/03*    (2006.01)
*G06F 3/0338*    (2013.01)
(Continued)

(52) U.S. Cl.
CPC .......... *G06F 3/0304* (2013.01); *G06F 3/0338* (2013.01); *G06F 1/169* (2013.01); *H01L 27/323* (2013.01); *H01L 27/3225* (2013.01)

(58) Field of Classification Search
CPC .......... G06F 3/0304; G06F 3/041; G06F 3/00; G06F 1/169; H04L 27/3225; H04L 27/323
See application file for complete search history.

(56) References Cited

U.S. PATENT DOCUMENTS

| 6,061,177 A * | 5/2000 | Fujimoto | G06F 3/0425 345/175 |
| 2003/0122779 A1* | 7/2003 | Martin | G06F 1/1662 345/156 |

(Continued)

FOREIGN PATENT DOCUMENTS

| TW | 200512433 A | 9/1992 |
| TW | 201137694 A | 11/2011 |
| TW | 201241703 A | 10/2012 |

OTHER PUBLICATIONS

Taiwanese First Office Action corresponding to TW Application No. 102103385; Date of Mailing: Dec. 24, 2014, with partial English translation.

*Primary Examiner* — Francis M Legasse, Jr.
(74) *Attorney, Agent, or Firm* — Cantor Colburn LLP

(57) ABSTRACT

An optical pointing device for detecting the direction of the user's finger is provided. The optical pointing device comprises a cover, a light source and a sensor. The cover comprises a press portion with a first surface and a second surface opposite the first surface, as well as a side wall extending downwards from the periphery of the second surface. The light source projects a main beam onto the press portion of the cover. The main beam then forms a first beam passing through the press portion and a second beam reflected by the second surface. The sensor is adapted to receive the second beam reflected by the second surface, and detect the second beam by an algorithm to output the first displacement position. In addition, the light source and the sensor are covered by the cover, while the side wall is a flexible side wall.

13 Claims, 3 Drawing Sheets

(51) Int. Cl.
  *H01L 27/32* (2006.01)
  *G06F 1/16* (2006.01)

(56) References Cited

U.S. PATENT DOCUMENTS

2012/0211656 A1\* 8/2012 Katz .................... G01S 17/026
                                              250/338.1
2012/0242622 A1   9/2012 Tseng et al.

\* cited by examiner

OPTICAL POINTING DEVICE AND METHOD FOR DETECTING AN OPTICAL POINTING

This application claims the benefit from the priority to Taiwan Patent Application No. 102103385 filed on Jan. 30, 2013, the disclosures of which are incorporated by reference herein in their entirety.

CROSS-REFERENCES TO RELATED APPLICATIONS

Not applicable.

BACKGROUND OF THE INVENTION

Field of the Invention

The present invention provides an optical pointing device and a detecting method thereof, and more particularly, to an optical pointing device for use in a digital mobile device and a detecting method thereof.

Descriptions of the Related Art

Compared to conventional desktop computers, digital mobile devices, such as notebook computers, have become the preferred choice for most consumers because of the good portability and performance that has gradually become comparable to that of desktop computers.

However, in consideration of portability, most notebook computers only have the keypad as a basic text input device, and have replaced the conventional mouse with a track pad. This makes the operation of the cursor unintuitive and makes it inconvenient to drag objects onto a screen.

In an attempt to allow users to operate the cursor more quickly, some notebook computers have a cursor pointing button in the keypad area. However, the cursor pointing button operates through mechanical movement and pressure, so it is difficult to make a quick response in real time despite the movement for the user's hands.

Aside from the notebook computers that have been described above, other kinds of digital mobile devices, such as mobile phones, have limited screen sizes and limited keypad areas. Even if such digital mobile devices are provided with a cursor pointing button similar to what has been described above, they cannot be provided with the mechanical movement and pressure sensing element. As a result, digital mobile devices are unable to sense the movement of the users' hands and thereby, unable to respond quickly.

Accordingly, it is important to provide an optical pointing device that is capable of sensing the movement of the users' hands and making a quick response in real time; in addition, a detection method thereof is needed as well.

SUMMARY OF THE INVENTION

An objective of the present invention is to provide an optical pointing device, which is adapted to sense the movement of the users' hands and respond with a corresponding force.

Another objective of the present invention is to provide a detection method for use in an optical pointing device. When the optical pointing device is continuously pressed by the user's finger towards a specific direction, the device can still perform phase detection to move the cursor.

To achieve the aforesaid objectives, the optical pointing device of the present invention comprises a cover, a light source and a sensor. The cover comprises a press portion with a first surface and second surface opposite the first surface, and a side wall extending downwards from the periphery of the second surface. The light source projects a main beam to the press portion of the cover. The main beam then forms a first beam passing through the press portion and a second beam reflected by the second surface. The sensor is adapted to receive the second beam reflected by the second surface, and detect the second beam by an algorithm to output the first displacement position. The light source and the sensor are covered by the cover, while the side wall is a flexible side wall.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
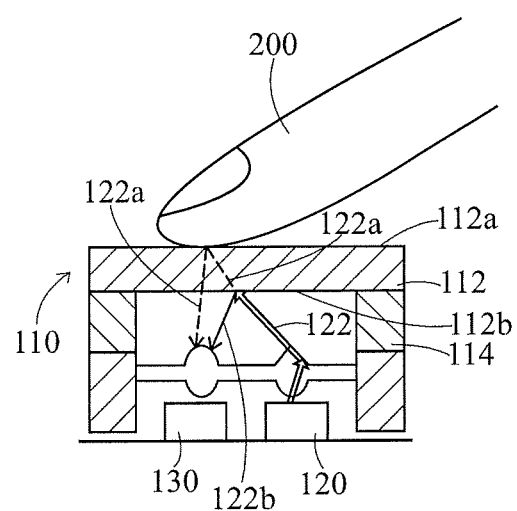
FIG. 1 is a cross-sectional view of an optical pointing device according to the present invention when coming into contact with a finger, but is not being pressed.

As shown in FIG. 1, an optical pointing device 100 of the present invention is adapted to detect a direction of a user's finger 200 to move a cursor on a screen of a digital mobile device such as a notebook computer or a mobile phone.

As shown, the optical pointing device 100 of the present invention comprises a cover 110, a light source 120 and a sensor 130. The cover 110 has a press portion 112 and a side wall 114. The press portion 112 has a first surface 112a and a second surface 112b opposite the first surface 112a. The side wall 114 extends downwards from the periphery of the second surface 112b. The light source 120 is adapted to project a main beam 122 to the press portion 112 of the cover 110. The main beam 122 then forms a first beam 122a passing through the press portion 112 and a second beam 122b reflected by the second surface 112b. It should be noted that for the convenience of describing the present invention, the sizes of the finger 200 and the optical pointing device 100 in the drawing are shown only for illustration but not to limit the actual scale. Moreover, the light source 120 and the sensor 130 are both covered by the cover 110. The side wall 114 is a flexible side wall.

Figure 2:
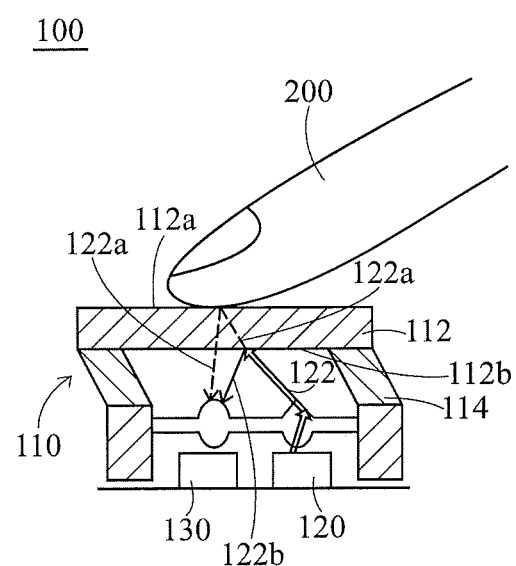
FIG. 2 is a cross-sectional view of an optical pointing device according to the present invention when coming into contact by a finger and being pressed.

With further reference to FIG. 2, when the cover 110 is pressed by the user's finger 200 to cause a change in the optical path of the second beam 122b, the sensor 130 is adapted to receive the second beam 122b reflected by the second surface 112b and detect the change of the second beam 122b by an algorithm to output a first displacement position P1 for the movement of the cursor.

Meanwhile, the first beam 122a passing through the press portion 112 is adapted to be reflected by the user's finger 200, while the sensor 130 is adapted to receive the first beam 122a reflected by the finger 200 and detect the first beam 122a by the algorithm to output a second displacement position P2. In this way, the sensor 130 can calculate the change in the cursor position more accurately according to the second displacement position P2 in addition to the first displacement position P1.

Furthermore, since the side wall 114 in this application is a flexible side wall, the side wall 114 is resiliently deformed in response to a horizontal movement of the press portion 112 when the user's finger 200 presses the cover 110 as shown in FIG. 2. Consequently, a good sense of movement is presented to the user's hands so that a corresponding force level can be felt as a feedback in response to the user's operation.

In the present invention, the light source 120 is preferably, but is not limited to, a light emitting diode (LED) light source or an infrared light source. Furthermore, the second surface 112b of the press portion 112 may be formed with a plurality of patterns so that the second surface 112b is patterned to cause significant variations in brightness of the second beam 122b reflected by the second surface 112b. This can assist the sensor 130 in performing the location detection by the algorithm more precisely when receiving the second beam 122b.

Preferably, the side wall 114 is made of a material selected from the group consisting of rubber, Polyurethane (PU) and the combination thereof to provide the flexibility required in the present invention so that the resilient deformation and a good sense of movement to the user's hands can be obtained. In other words, the side wall 114 may also be formed to sense the movement of the user's hands by mixing materials such as rubber, PU and the like in different proportions by those of ordinary skill in the art. As a result, the cover 110 will respond with different force levels from which the users can choose their option. On the other hand, the press portion 112 of the cover 110 is made of a material selected from a group consisting of Polycarbonate (PC), Polymethyl methacrylate (PMMA), Acrylonitrile Butadiene Styrene (ABS) and the combination thereof to provide an appropriate reflection/transmission interface for the main beam 122.

Figure 3:
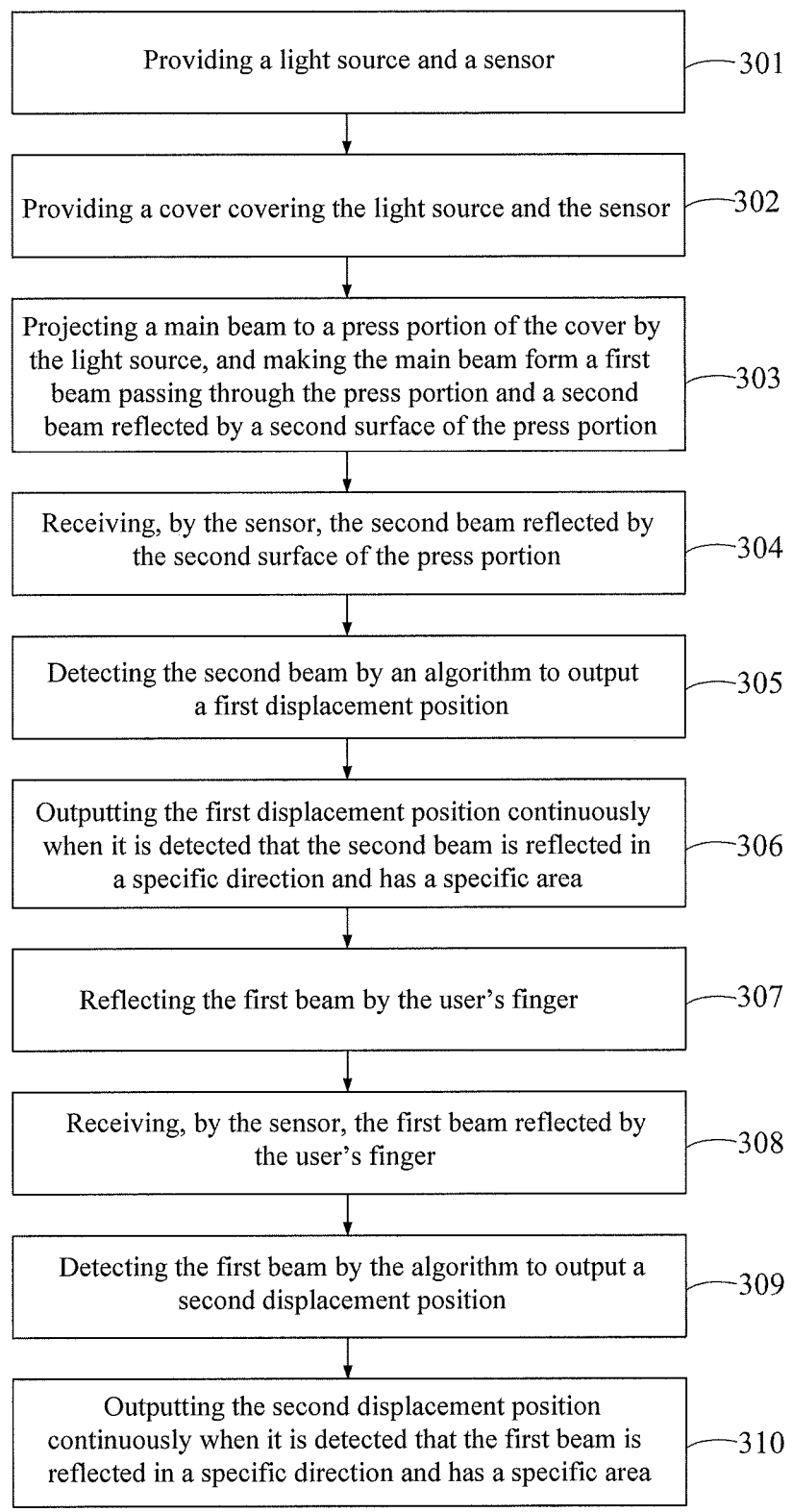
FIG. 3 is a flowchart diagram of a method for detecting an optical pointing according to the present invention.

As shown in FIG. 3, the present invention also provides a method for detecting an optical pointing which comprises the following steps. Firstly, as shown in step 301 and step 302, the light source 120 and the sensor 130 are provided and then the cover 110 is provided to cover the light source 120 and the sensor 130. Subsequently, as shown in step 303, the main beam 122 is projected from the light source 120 to the press portion 112 of the cover 110 so that the main beam 122 forms a first beam 122a passing through the press portion 112 and a second beam 122b reflected by the second surface 112b of the press portion 112. Finally, as shown in step 304 and step 305, after receiving the second beam 122b reflected by the second surface 112b of the press portion 112, the sensor 130 can detect the second beam 122b by an algorithm to output a first displacement position P1 for the movement of the cursor. In this way, the method for detecting an optical pointing of the present invention can be easily accomplished by the aforesaid steps.

On the other hand, in case the optical pointing device 100 is continuously pressed by the user's finger 200 towards a specific direction, the first displacement position P1 is outputted continuously so that the cursor can move continuously in the specific direction when the sensor 130 detects that the second beam 122b is reflected in a specific direction and has a specific area, as shown in step 306.

Furthermore, the detection method described above may further comprise the following steps: as shown in step 307, the first beam 122a is reflected by the user's finger 200; as shown in step 308, the first beam 122a reflected by the finger 200 is received by the sensor 130; and as shown in step 309, the first beam 122a is detected by the aforesaid algorithm to output a second displacement position P2. Accordingly, since the sensor 130 can receive the second beam 122b reflected by the second surface 112b of the press portion 112 and the first beam 122a reflected by the finger 200 simultaneously, the method for detecting an optical pointing of the present invention allows the optical pointing device 100 to perform locating operations more precisely to drive the cursor by calculating the first displacement position P1 and the second displacement position P2 respectively.

Similarly, in case the optical pointing device 100 is continuously pressed by the user's finger 200 towards a specific direction, the second displacement position P2 is outputted continuously so that the cursor can move continuously in the specific direction when the sensor 130 detects that the first beam 122a is reflected in a specific direction and has a specific area, as shown in step 310.

According to the above descriptions, when the cover 110 is pressed by the user's finger 200, the optical pointing device 100 disclosed in the present invention senses the user's hands and responds with a corresponding force level to the user's operation because of the action of the flexible side wall 114. On the other hand, the method for detecting an optical pointing disclosed in the present invention can also locate the cursor more precisely by detecting the first beam 122a and the second beam 122b by the aforesaid algorithm. In addition, even when the optical pointing device 100 is continuously pressed by the user's finger 200 towards a specific direction, the sensor 130 can still perform the phase detection to move the cursor, thereby making the operation more intuitive.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An optical pointing device for detecting a finger's direction of a user, comprising:
   a cover, comprising a press portion and a side wall, the press portion having a first surface and a second surface opposite the first surface, the side wall extending downward from the periphery of the second surface, and the press portion and the side wall are two separate elements;
   a light source, projecting a main beam to the press portion of the cover, wherein the main beam then forms a first beam passing through the press portion and a second beam reflected by the second surface; and
   a sensor, being adapted to receive the second beam reflected by the second surface, and detect the second beam by an algorithm to output a first displacement position;
   wherein the light source and the sensor are covered by the cover, and the side wall is a flexible side wall, and the side wall is deformable according to a horizontal movement of the press portion.

2. The optical pointing device as claimed in claim 1, wherein the first beam passing through the press portion is adapted to be reflected by the user's finger, and the sensor is adapted to receive the first beam reflected by the user's finger.

3. The optical pointing device as claimed in claim 1, wherein the light source is an LED light source.

4. The optical pointing device as claimed in claim 1, wherein the second surface is formed with a plurality of patterns.

5. The optical pointing device as claimed in claim 1, wherein the side wall is made of a material selected from the group consisting of rubber, Polyurethane (PU) and the combination thereof.

6. The optical pointing device as claimed in claim 1, wherein the press portion is made of a material selected from the group consisting of Polycarbonate (PC), Polymethyl methacrylate (PMMA), Acrylonitrile Butadiene Styrene (ABS) and the combination thereof.

7. The optical pointing device as claimed in claim 2, wherein the sensor is adapted to detect the first beam by the algorithm to output a second displacement position after receiving the first beam reflected by the user's finger.

8. A method for detecting an optical pointing, which is utilized for detecting a finger's direction of a user, comprising the following steps:
 (a) providing a light source and a sensor;
 (b) providing a cover covering the light source and the sensor;
 (c) projecting a main beam to a press portion of the cover by the light source, and making the main beam form a first beam passing through the press portion and a second beam reflected by a second surface of the press portion;
 (d) receiving, by the sensor, the second beam reflected by the second surface of the press portion; and
 (e) detecting the second beam by an algorithm to output a first displacement position;
 wherein the cover comprises a side wall, the side wall extends downward from the periphery of the second surface, and the side wall is a flexible side wall, and the side wall is deformable according to a horizontal movement of the press portion.

9. The method as claimed in claim 8, further comprising the following steps:
 (f) outputting the first displacement position continuously when it is detected that the second beam is reflected in a specific direction and has a specific area.

10. The method as claimed in claim 8, wherein the press portion comprises a first surface opposite the second surface, and the second surface is formed with a plurality of patterns.

11. The method as claimed in claim 8, wherein the side wall is made of a material selected from the group consisting of rubber, Polyurethane (PU) and the combination thereof.

12. The method as claimed in claim 9, further comprising the following steps:
 (g) reflecting the first beam by the user's finger;
 (h) receiving, by the sensor, the first beam reflected by the user's finger; and
 (i) detecting the first beam by the algorithm to output a second displacement position.

13. The method as claimed in claim 12, further comprising the following steps:
 (j) outputting the second displacement position continuously when it is detected that the first beam is reflected in a specific direction and has a specific area.

* * * * *